US009263433B2

(12) United States Patent
Sofer et al.

(10) Patent No.: US 9,263,433 B2
(45) Date of Patent: Feb. 16, 2016

(54) INTEGRATED CIRCUIT, INTEGRATED CIRCUIT PACKAGE AND METHOD OF PROVIDING PROTECTION AGAINST AN ELECTROSTATIC DISCHARGE EVENT

(75) Inventors: Sergey Sofer, Rishon Lezion (IL); Valery Neiman, Rishon Lezion (IL); Michael Priel, Netanya (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 80 days.

(21) Appl. No.: 14/359,695

(22) PCT Filed: Nov. 22, 2011

(86) PCT No.: PCT/IB2011/055231
§ 371 (c)(1),
(2), (4) Date: May 21, 2014

(87) PCT Pub. No.: WO2013/076527
PCT Pub. Date: May 30, 2013

(65) Prior Publication Data
US 2015/0270259 A1    Sep. 24, 2015

(51) Int. Cl.
*H02H 3/22* (2006.01)
*H01L 27/02* (2006.01)
*H01L 23/04* (2006.01)
*H01L 23/50* (2006.01)
H02H 9/04 (2006.01)
H05K 1/02 (2006.01)

(52) U.S. Cl.
CPC ............ *H01L 27/0285* (2013.01); *H01L 23/04* (2013.01); *H01L 23/50* (2013.01); *H01L 2924/0002* (2013.01); *H02H 9/04* (2013.01); *H02H 9/046* (2013.01); *H05K 1/0259* (2013.01)

(58) Field of Classification Search
USPC .................................................. 361/56, 111
See application file for complete search history.

(56) References Cited

U.S. PATENT DOCUMENTS

| 7,164,565 B2 | 1/2007 | Takeda |
| 7,209,332 B2 | 4/2007 | Stockinger |
| 7,245,468 B2 | 7/2007 | Griesbach et al. |
| 7,394,638 B2 | 7/2008 | Ahmad et al. |
| 7,580,233 B2 | 8/2009 | Davis |

(Continued)

FOREIGN PATENT DOCUMENTS

WO    2010-131078 A1    11/2010

OTHER PUBLICATIONS

International Search Report and Written Opinion correlatingo PCT/IB2011/055231 dated Aug. 22 2012.

*Primary Examiner* — Danny Nguyen

(57) ABSTRACT

An integrated circuit comprising a power supply node, a ground node and a gated domain coupled between the power node and the ground node. A Charged Device Model electrostatic discharge protection module is provided for shunting electrical energy of a CDM ESD event away from the gated domain. A gating switch makes an electrical connection in a connected state between the gated domain and at least one of the power node and the ground node. ESD gating control circuitry is coupled to the CDM ESD protection module and controls shunting of energy away from the gated domain by the CDM ESD protection module, thereby avoiding the energy flowing through the gated domain. The ESD gating control circuitry inhibits actuation of the CDM ESD protection module to prevent response to CDM ESD events when the gating domain is powered-up.

17 Claims, 3 Drawing Sheets

(56) References Cited

U.S. PATENT DOCUMENTS

| | | |
|---|---|---|
| 2009/0201615 A1 | 8/2009 | Bernard et al. |
| 2010/0157491 A1 | 6/2010 | Hong |
| 2012/0002334 A1* | 1/2012 | Kosonocky ......... H01L 27/0292 361/56 |
| 2012/0307405 A1* | 12/2012 | Chen ..................... H02H 9/046 361/56 |

* cited by examiner

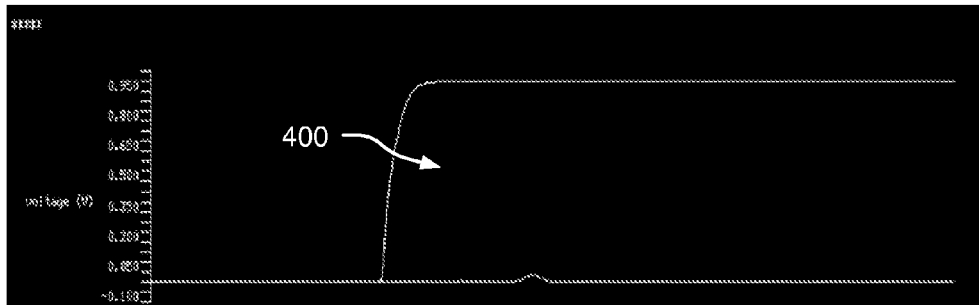
Fig. 4
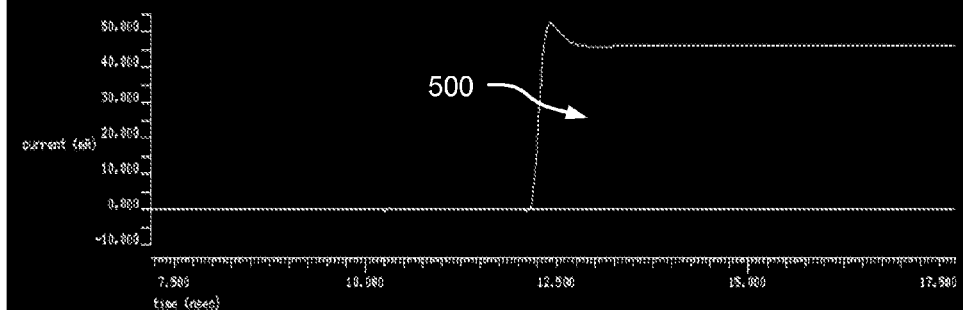
Fig. 5
Fig. 6
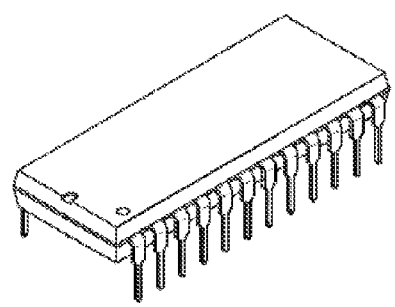

US 9,263,433 B2

INTEGRATED CIRCUIT, INTEGRATED CIRCUIT PACKAGE AND METHOD OF PROVIDING PROTECTION AGAINST AN ELECTROSTATIC DISCHARGE EVENT

FIELD OF THE INVENTION

This invention relates to an integrated circuit. This invention also relates to a method of providing an integrated circuit with protection against an electrostatic discharge event. This invention further relates to an integrated circuit package.

BACKGROUND OF THE INVENTION

Typically, Integrated Circuits (ICs) are provided with ElectroStatic Discharge (ESD) protection circuitry. The ESD protection circuitry protects parts of an integrated circuit by clamping ESD-stressed terminals during an ESD event, and serves to divert an electrostatic discharge current away from protected parts of the integrated circuit, and thus to dissipate the "stress" energy without damage to the integrated circuit.

It is known for integrated circuits provided with power gating capabilities to comprise such ESD protection circuitry. Such integrated circuits typically include one or more so-called "gating switches" on-die, the gating switches being a kind of semiconductor switch that connects a local power supply and/or a ground of one or more circuit blocks, hereinafter referred to as a gated domain, to a main or continuous power supply and/or ground, respectively. The gating switch has a low impedance in a closed (connecting) state, and a high impedance in an open (disconnecting) state. The power supply to the power gated domain can be enabled or disabled by changing the state of the gating switch. Thus, the power supply to a gated domain can be turned off temporarily when not needed, for example to reduce the overall power consumption of the integrated circuit or to reduce noise levels. This temporary shutdown is also referred to as "low power mode" or "inactive mode". When the circuit blocks of the gated domain are required again, they are activated by "closing" the gating switch so as to transition the mode to an "active mode", thereby electrically coupling the power supply or ground to the gated domain.

A number of different types of ESD stress is known. A first category are types related to a transfer of an electrostatic charge into the chip by a charged external body, such as a human body or machine, fixture, or tool, for example so-called "Human Body Model" (HBM) and so-called "Machine Model" (MM) ESD Another category relates to the chip, or an internal part thereof, itself being charged and the subsequent electrostatic discharge thereof, so-called "Charged Device Model" (CDM) ESD. In contrast to HBM and MM ESD stresses that originate from pins of a chip, via the CDM ESD stress is typically generated "internally" in the device, for example when a charged device in the gated domain discharges to a grounded surface through a device pin. Such a charge can build up by, for example, exposing an integrated circuit to an electromagnetic field.

Known circuits to protect gated domains from such CDM ESD stresses demonstrate acceptable performance provided that the power-up time of the gated domain is below a certain threshold. In this respect, CDM ESD stress protection circuits are known to trigger in response to a predetermined voltage level and/or a predetermined slew rate of the voltage level being monitored. The need to consider the slew rate of the power voltage has become increasingly important to be able to detect CDM ESD events in relation to modern circuit technologies, because voltage levels that are slightly higher than the voltage level of the power supply, for example by 10% to 15%, can result in device failure and so a more rapid detection than simply monitoring voltage levels is required. However, it has been discovered by the inventors that triggering of a CDM ESD protection circuit based at least partly upon slew rate as a parameter results in false triggering of the CDM ESD protection circuit when the power-up time of the gated domain conflicts with the slew rate to be detected by the CDM ESD protection circuit. To this end, falsely triggering the CDM ESD protection circuit results, for example, in the power supply terminal or node for the gated domain being short-circuited to ground potential, causing the power system of an integrated circuit to "collapse", which is clearly disadvantageous. The alternative is not to provide gated domains of integrated circuits with CDM ESD stress protection, but this too is clearly disadvantageous.

SUMMARY OF THE INVENTION

The present invention provides an integrated circuit, a method of providing an integrated circuit with protection against an electrostatic discharge event and an integrated circuit package as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 4 is a graph of voltage versus time in respect of performance of the Charged Device Model electrostatic discharge protection circuit of FIG. 2; and FIG. 5 is a graph of current versus time in respect of performance of the Charged Device Model electrostatic discharge protection circuit of FIG. 2.

FIG. 6 shows a perspective view of an example of an integrated circuit package

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
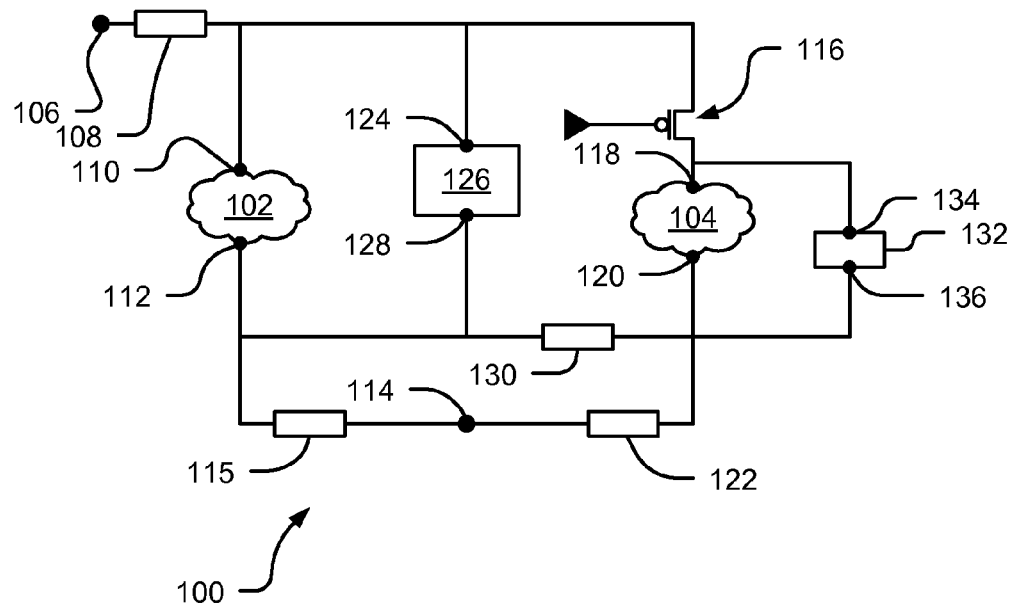
FIG. 1 is a schematic diagram of an example of an integrated circuit.

Referring to FIG. 1, an integrated circuit 100 may comprise a number of logic domains, which as explained above are functional areas of circuitry that support execution of one or more applications for which the integrated circuit 100 is intended, for example a core or co-processor. Some logic domains may have a local power supply or ground, separated from the main power supply or ground, creating one or more separate power domains. In this example, in order not to distract from the teachings herein, only two domains are described: a continuous power domain and a switched power domain. The skilled person will, of course, appreciate that a greater or smaller number of domains can be employed.

As such, in this example, the integrated circuit 100 comprises a continuous power domain having a continuous power domain logic circuit 102 and a switched power domain having switched power domain logic circuit 104. The switched power domain is sometimes known as a gated domain. The integrated circuit 100 is coupled to a power supply pin 106 of an integrated circuit package (as shown in FIG. 6) that houses the integrated circuit 100 via a power network (or "net"), which is not specifically shown in FIG. 1, but having a power supply impedance 108 represented figuratively in FIG. 1. An output of the power net is coupled to a first power supply node 110 of the continuous power domain logic circuit 102, a first local ground node 112 thereof being coupled to a ground pin 114 of the integrated circuit package via a first ground impedance 115, which is representative of the impedances between grounding points of the integrated circuit and the ground pin 114.

The output of the power net may also be coupled to a switching device, for example a gating switch 116, such as an NMOSFET, having a connected state and a disconnected state. However, other solid state switching devices can be employed. In this example, the output of the power net is coupled to a drain terminal of the NMOS gating switch 116. A source terminal of the gating switch 116 is coupled to a second power supply node 118 of the switched power domain logic circuit 104, a second local ground node 120 thereof being coupled to the ground pin 110 of the integrated circuit package via a second ground impedance 122, which is representative of other impedances between grounding points of the integrated circuit and the ground pin 114. A gate terminal of the gating switch 116 is coupled to a source of a power gate disable signal (not shown) in order to control the gating switch 116. The source of the power gate disable signal may be a control logic circuit (not shown) disposed in the continuous power domain logic circuit 102, and controlled by external pins (not shown) coupled to the integrated circuit. In this example, it should be appreciated that the power gate disable signal operates in accordance with a negative logic scheme, for example logic LOW corresponds to an enable state and logic HIGH corresponds to a disable state. A trigger disable signal is derived from the power gate disable signal, for example using a timed latched version of the signal so that copies the state change of the power gate disable signal for a limited duration corresponding to a power-up time of the switched power domain logic circuit 104, or a differentiated version of the power gate disable signal.

The output of the power net may also be coupled to a third power supply node 124 of a first ESD protection circuit 126. The first ESD protection circuit 126 is provided in order to protect the continuous power domain logic circuit 102 from HBM ESD events, MM ESD events and CDM ESD events. However, the first ESD protection circuit 126 can also provide protection to the switched power domain logic circuit 104 against HBM and MM types of ESD stress. As the embodiments set forth herein are not concerned with this aspect of ESD protection, the structure of the first ESD protection circuit 126 will not be described in further detail. However, the skilled person should appreciate that any suitable circuit that provides HBM and MM and CDM ESD stress protection can be employed. As can be seen from FIG. 1, the first ESD protection circuit 126 is coupled in parallel across the continuous power domain logic circuit 102. A third local ground node 128 of the first ESD protection circuit 126 is therefore also coupled to the first local ground node 112 of the continuous power domain logic circuit 102. The first ESD protection circuit 126 is also coupled in parallel across the switched power domain logic circuit 104.

The third local ground node 128 of the first ESD protection circuit 126 is also coupled to the ground pin 114 via a third ground impedance 130, which is coupled to the second ground impedance 122. In this example, the third ground impedance 130 is also representative of yet more impedances between grounding points of the integrated circuit and the ground pin 114.

In order to protect the switched power domain logic circuit 104 from CDM ESD events, a second ESD protection circuit 132 is coupled across the switched power domain logic circuit 104. In particular, a fourth power supply node 134 of the second ESD protection circuit 132 is coupled to the source terminal of the gating switch 116 and the second power supply node 118 of the switched power domain logic circuit 104. A fourth local ground node 136 is coupled to the second local ground node 120, and the ground pin 114 via the second ground impedance 122.

Figure 2:
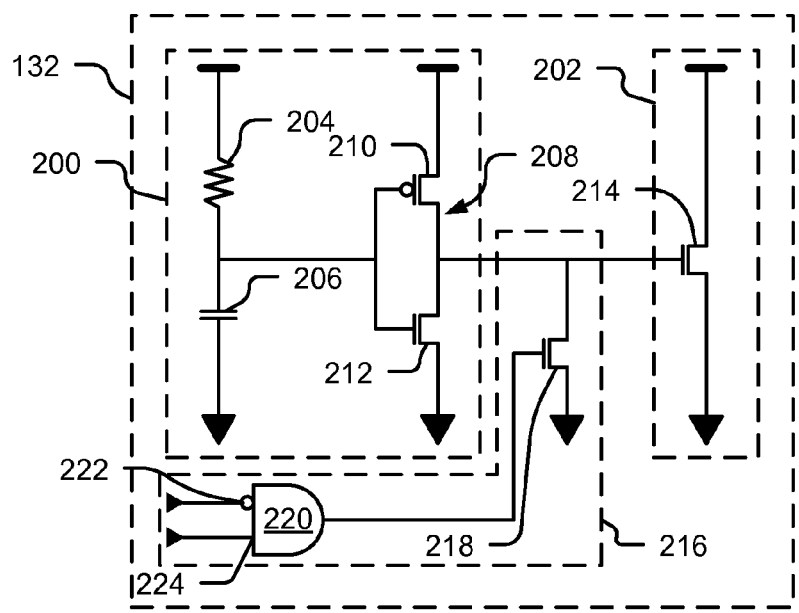
FIG. 2 is a schematic diagram of an example of a Charged Device Model electrostatic discharge protection circuit suitable for the example of FIG. 1.

Turning to FIG. 2, the second ESD protection circuit 132 comprises an ESD gating control circuit 200 operably coupled to a CDM ESD protection module 202 for shunting electrical energy of a CDM ESD event away from the gated domain 104. However, it should be understood that this kind of circuit can also be used to provide protection against other kinds of ESD events, for example HBM and MM ESD events. The ESD gating control circuit 200 comprises a slew rate sensor module, for example a differentiator comprising a resistance 204 having a first terminal coupled to the fourth power supply node ($V_{DDG}$) 118 and a second terminal coupled to a first terminal of a capacitance 206, a second terminal of the capacitance 206 being coupled to the fourth local ground node 136. Although in this example, the ESD gating control circuit 200 comprises a differentiator, the skilled person should appreciate that other kinds of slew rate sensor circuit can be employed.

The second terminal of the resistance 204 and the first terminal of the capacitance 206 are coupled to an inverter module 208 comprising a first NMOSFET 210 having a drain coupled to the fourth power supply node 118 and a gate coupled to the second terminal of the resistance 204 and the first terminal of the capacitance 206. A source of the first NMOSFET 210 is coupled to a drain of a first PMOSFET 212, a source of the first PMOSFET 212 being coupled to the fourth local ground node 136. The gate of the first PMOSFET 212 is also coupled to the second terminal of the resistance 204 and the first terminal of the capacitance 206. The source of the first NMOSFET 210 coupled to the drain of the first PMOSFET 212 constitute an output that is coupled to the CDM ESD protection module 202, in particular in this example, a gate of a second NMOSFET 214, a drain of the second NMOSFET 214 being coupled to the fourth power supply node 118 and a source of the second NMOSFET 214 being coupled to the fourth local ground node 120.

The inverter module 208 is, in this example, a threshold-based digital switch. As such, the inverter module 208 constitutes a digital signal generator, but is also an amplifier that is capable of driving the heavy load of the CDM ESD protection module 202.

In order to prevent false triggering of the CDM ESD protection module 202, an actuation disable module 216 is coupled to the ESD gating control circuit 200. In this example, the output of the inverter 208 is coupled to the actuation disable module 216. However, the skilled person should appreciate that this is not the sole coupling point in the second ESD protection circuit 132 and the actuation disable module 216 can be coupled to other points, for example, in the ESD gating control circuit 200. One possible location, assuming the actuation disable module 216 is suitably modified, is between the differentiator and the inverter 208.

In this example, the actuation disable module 216 comprises a third NMOSFET 218, which is an example of a switching device, having a drain coupled to the output of the inverter 208 and hence the ESD gating control circuit 200 and a source coupled to the fourth local ground node 136. A gate of the third NMOSFET 218 is coupled to an output of a logic circuit, for example an AND logic gate 220 having a first inverting input 222 coupled to the source of the power gate disable signal and a non-inverting input 224 coupled to the output of the power net ($V_{DDC}$).

Figure 3:
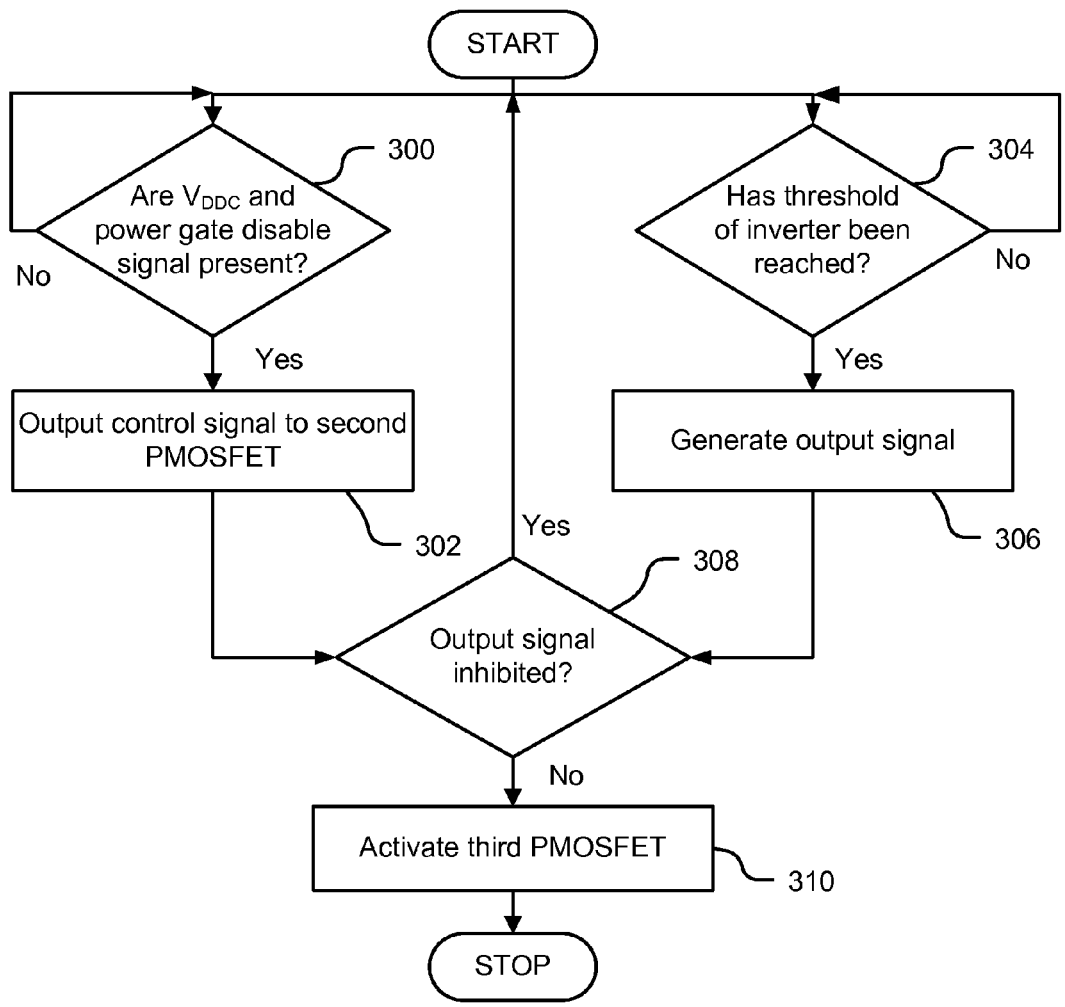
FIG. 3 is a flow diagram of an example of a method of providing an integrated circuit with protection against an electrostatic discharge event.

In operation (FIG. 3), the integrated circuit is assumed to be in a powered-up state, resulting in the presence of the supply voltage, $V_{DDC}$, at the output of the power net. As such, the continuous power domain logic circuit 102 is also in a powered-up state. As the protection of this domain logic is not directly relevant to the operation of the embodiment described herein in relation to CDM ESD events, in order not to distract from the teachings relating to protection from CDM ESD events, operation of the first ESD protection circuit 126 will not be described herein. In this example, it is assumed that the switched power domain logic circuit 104 is in an inactive mode, i.e. in a powered-down state, but that an instruction to power-up the switched power domain 104 has been issued and hence the state of the power gate disable signal has changed from a logic HIGH to a logic LOW. Similarly, the trigger disable signal "follows" the state of the power gate disable signal for a limited duration corresponding to the power-up time needed for by the switched power domain logic circuit 104. Also, the gating switch enters the connected state and so makes an electrical connection between the gated domain and a power supply node (not shown) at the drain side of the gating switch, the power supply node being coupled to voltage supply of the integrated circuit.

Consequently, the trigger disable signal applied to the inverting input 222 of the AND logic gate 220 is inverted to become a logic HIGH signal. Also, the supply voltage, $V_{DDC}$, is applied at the non-inverting input 224 of the AND logic gate 220 and also constitutes a logic HIGH signal (Step 300). Consequently, the AND logic gate 220 responds to the two logic HIGH input signals by generating a logic HIGH output signal 400 (FIG. 4), constituting a disable control signal, which is applied to the gate of the second NMOSFET 218. The third NMOSFET 218 therefore enters a conduction mode (Step 302). As the third NMOSFET 218 has a lower impedance than the first PMOSFET 210 of the CDM ESD protection module 202, the third NMOSFET 218 sinks any current 500 (FIG. 5) output from the inverter 208, i.e. forces a low voltage level at the gate of the ESD protection module 202, and so a control signal does not effectively "reach" the CDM ESD protection module 202, thereby inhibiting actuation of the CDM ESD protection module 202 and so preventing response to CDM ESD events when the switched power domain logic is being powered-up. In this respect, and in this example, the rate at which the switched power domain logic 204 is powered-up is sufficiently fast to be detected by the ESD gating control circuit 200 as a CDM ESD event. The voltage-time profile of the supply voltage, $V_{DDC}$, and hence the voltage-time profile, $V_{DDG}$, at the fourth power supply node 118 is such that the output of the slew rate sensor is sufficiently high to meet or exceed a threshold voltage of the inverter 208 (Step 304). In this respect, the power-up time of the voltage signal of the power supply to the gated domain is shorter than a trigger time constant of the ESD gating control circuitry 200. Consequently, the inverter 208 generates a digital output signal (Step 306), namely a logic HIGH signal constituting an activation control signal that, if not inhibited or "neutralised" by the actuation disable module 216, results in the CDM ESD protection module 202 being falsely actuated and hence a short-circuit being created across the switched power domain logic circuit 104 by the CDM ESD protection module 202. Hence, in the present example, this false triggering or response and short-circuit is prevented, because the second NMOSFET 218 sinks current output from the inverter 208.

Of course, once the switched power domain logic circuit 104 has been powered-up, the trigger disable signal changes state from logic LOW back to logic HIGH and so the inhibition of the second ESD protection circuit 132 from responding to CDM ESD events is no longer present (Steps 308 and 310). When no CDM ESD event occurs, the ESD gating control circuitry 200 is inactive.

It is thus possible to provide a CDM ESD protection circuit 132 that does not incorrectly respond to a voltage-time profile that is associated with powering-up a switched power domain. Consequently, incorrect short-circuiting of a power node of the switched power domain does not take place during powering-up of the switched power domain and so malfunction of the switched power domain is avoided.

Of course, the above advantages are exemplary, and these or other advantages may be achieved by the invention. Further, the skilled person will appreciate that not all advantages stated above are necessarily achieved by embodiments described herein.

In the foregoing specification, the invention has been illustrated with reference to specific examples of embodiments of the invention. It will, however, be evident that various modifications and changes may be made therein without departing from the broader scope of the invention as set forth in the appended claims, which are hence not limited to the specific examples described. For example, the second ESD protection circuit 132 is described herein in the context of positive logic. However, the skilled person should appreciate that the embodiments described herein can be applied to implementations using negative logic with suitable modification that would be appreciated by the skilled person. Where negative logic is employed, the gating switch may serve to make an electrical connection between the gated domain and a ground node connectable to ground potential. Consequently, the power gating switch can be an NMOSFET switch controlled by the positive signal.

Some of the above embodiments, as applicable, may be implemented using a variety of different information processing architectures for integrated circuit designs. For example, although FIG. 1 and the discussion thereof describe an exemplary integrated circuit design, this exemplary design is presented merely to provide a useful reference in discussing various aspects of the invention. Of course, the description of the design has been simplified for purposes of discussion, and it is just one of many different types of appropriate designs that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the layouts depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also, for example, although the CDM ESD protection module 202 comprises, in the example described herein, a NMOSFET device serving as a "clamp" between the fourth power supply node 118 and the fourth local ground node 136, the skilled person should appreciate that other types of clamp circuit, for example diode-based or rectifier-based clamp circuits, can be employed.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The examples set forth herein, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:

1. An integrated circuit, comprising:
   a power supply node connectable to a voltage supply;
   a ground node connectable to ground potential;
   a gated domain coupled between the power supply node and the ground node;
   a Charged Device Model electrostatic discharge protection module for shunting electrical energy of a Charged Device Model electrostatic discharge event away from the gated domain;
   a gating switch having a connected state and a disconnected state, the gating switch being arranged to make an electrical connection in the connected state between the gated domain and at least one of the power supply node and the ground node;
   electrostatic discharge gating control circuitry operably coupled to the Charged Device Model electrostatic discharge protection module and arranged to control shunting of electrical energy away from the gated domain by the Charged Device Model electrostatic discharge protection module, thereby avoiding the electrical energy flowing through the gated domain; wherein
   the electrostatic discharge gating control circuitry is arranged to inhibit actuation of the Charged Device Model electrostatic discharge protection module to prevent response to Charged Device Model electrostatic discharge events when the gating domain is being powered-up.

2. An integrated circuit as claimed in claim 1, wherein the Charged Device Model electrostatic discharge protection module is a clamp circuit.

3. An integrated circuit as claimed in claim 1, wherein the electrostatic discharge gating control circuitry comprises a slew rate sensor module coupled to a digital signal generator.

4. An integrated circuit as claimed in claim 3, wherein the slew rate sensor module is a differentiator.

5. An integrated circuit as claimed in claim 3, wherein the digital signal generator is an inverter.

6. An integrated circuit as claimed in claim 1, wherein the electrostatic discharge gating control circuitry comprises an actuation disable module arranged to inhibit actuation of the Charged Device Model electrostatic discharge protection module to prevent response to Charged Device Model electrostatic discharge events when the gating domain is being powered-up.

7. An integrated circuit as claimed in claim 6, wherein the actuation disable module comprises:
   a switching device arranged to prevent the generation of an activation control signal being communicated from the electrostatic discharge gating control circuitry to the Charged Device Model electrostatic discharge protection module.

8. An integrated circuit as claimed in claim 7, wherein
the electrostatic discharge gating control circuitry comprises an output at which the activation control signal is provided, the Charged Device Model electrostatic discharge protection module having an input operably coupled to the output in order to receive the activation control signal; and
the switching device is operably coupled to the input and the output in order to draw current applied at the output away from the input.

9. An integrated circuit as claimed in claim 6, wherein the actuation disable module comprises a logic circuit operably coupled to a control terminal of the switching device.

10. An integrated circuit as claimed in claim 9, wherein the logic circuit is arranged to issue a disable control signal to the switching device in response to detection of a power-up control signal and a continuous supply voltage from the power supply node.

11. An integrated circuit as claimed in claim 1, wherein
the gated domain has a local ground connected to the ground node and a gated power supply coupled to the power supply node, and
the Charged Device Model electrostatic discharge protection module has a control input for controlling shunting of the electrical energy away from the gated domain between the local ground and the gated power supply.

12. An integrated circuit as claimed in claim 1, wherein
the Charged Device Model electrostatic discharge protection module has a trigger time constant associated therewith relating to identification of the Charged Device Model electrostatic discharge event, and
the gated domain has a power-up time of the gated domain shorter than the trigger time constant.

13. An integrated circuit as claimed in claim 1, wherein the electrostatic gating control circuitry is inactive in the absence of the Charged Device Model electrostatic discharge event.

14. An integrated circuit as claimed in claim 7, wherein the switching device is a Field Effect Transistor.

15. An integrated circuit as claimed in any claim 1, wherein the Charged Device Model electrostatic discharge protection module comprises a switching device coupled between the power supply node and the ground node.

16. An integrated circuit package, comprising:
a power supply node connectable to a voltage supply;
a ground node connectable to ground potential;
a gated domain coupled between the power supply node and the ground node;
a Charged Device Model electrostatic discharge protection module for shunting electrical energy of a Charged Device Model electrostatic discharge event away from the gated domain;
a gating switch having a connected state and a disconnected state, the gating switch being arranged to make an electrical connection in the connected state between the gated domain and at least one of the power supply node and the ground node;
electrostatic discharge gating control circuitry operably coupled to the Charged Device Model electrostatic discharge protection module and arranged to control shunting of electrical energy away from the gated domain by the Charged Device Model electrostatic discharge protection module, thereby avoiding the electrical energy flowing through the gated domain; wherein
the electrostatic discharge gating control circuitry is arranged to inhibit actuation of the Charged Device Model electrostatic discharge protection module to prevent response to Charged Device Model electrostatic discharge events when the gating domain is being powered-up;
a housing which houses at least part the integrated circuit;
a first pin coupled to the power supply node; and
a second pin coupled to the ground node.

17. A method of providing an integrated circuit with protection against a Charged Device Model electrostatic discharge event that avoids false triggering in response to powering-up of a gated domain by a gating switch, the method comprising:
powering-up the gated domain by making an electrical connection between the gated domain and at least one of a power supply node and a ground node;
controlling shunting of electrical energy away from the gated domain when a Charge Device Model electrostatic discharge event occurs, thereby avoiding the electrical energy flowing through the gated domain; and
inhibiting response to Charged Device Model electrostatic discharge events when the gating domain is being powered-up.

* * * * *